United States Patent
Okita

(10) Patent No.: US 10,002,060 B2
(45) Date of Patent: *Jun. 19, 2018

(54) MATRIX CIRCUIT DETECTING FAILURE LOCATION IN COMMON SIGNAL

(71) Applicant: FANUC Corporation, Yamanashi (JP)

(72) Inventor: Hiroshi Okita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 82 days.

This patent is subject to a terminal disclaimer.

(21) Appl. No.: 14/974,465

(22) Filed: Dec. 18, 2015

(65) Prior Publication Data

US 2016/0178689 A1  Jun. 23, 2016

(30) Foreign Application Priority Data

Dec. 19, 2014  (JP) .................. 2014-257498

(51) Int. Cl.
*G01R 31/08* (2006.01)
*G06F 11/22* (2006.01)
*G01R 31/02* (2006.01)

(52) U.S. Cl.
CPC ........ *G06F 11/2221* (2013.01); *G01R 31/024* (2013.01); *G01R 31/086* (2013.01)

(58) Field of Classification Search
CPC .... G01R 31/02; G01R 31/024; G01R 31/025; G01R 31/08–31/11; G06F 11/22; G06F 11/2205; G06F 11/2221
See application file for complete search history.

(56) References Cited

U.S. PATENT DOCUMENTS

| 3,964,018 A * | 6/1976 | Strait ..................... G07C 5/006 180/271 |
| 6,104,320 A * | 8/2000 | Tu .......................... G06F 3/023 341/20 |
| 6,535,146 B1 * | 3/2003 | Chang ................... H03M 11/02 341/26 |
| 6,873,174 B2 * | 3/2005 | Matsunaga ............ G09G 3/006 324/760.02 |

(Continued)

FOREIGN PATENT DOCUMENTS

| JP | S61-58025 A | 3/1986 |
| JP | 62-49752 A | 3/1987 |

(Continued)

OTHER PUBLICATIONS

Office Action in JP Application No. 2014-257498, dated Mar. 7, 2017.

*Primary Examiner* — Huy Q Phan
*Assistant Examiner* — David Frederiksen
(74) *Attorney, Agent, or Firm* — Hauptman Ham, LLP

(57) ABSTRACT

A matrix circuit includes, besides a plurality of common signal lines and a plurality of data signal lines arranged in a matrix, a plurality of monitoring signal lines that allow states of the common signal lines to be monitored. Inputs to the monitoring signal lines during one scan of the common signal lines are stored such that a fault including a ground fault, a short circuit, or disconnection on any of the common signal lines is detected and a location of the faulty common signal line is identified based on the stored inputs to the monitoring signal lines.

6 Claims, 11 Drawing Sheets

(56) References Cited

U.S. PATENT DOCUMENTS

| | | | |
|---|---|---|---|
| 8,195,355 B2* | 6/2012 | Inoue | F02D 41/22 |
| | | | 324/511 |
| 9,513,325 B2* | 12/2016 | Yoshida | G06F 3/0202 |
| 2005/0105230 A1* | 5/2005 | Bailey | G01R 19/2513 |
| | | | 361/90 |
| 2005/0270059 A1 | 12/2005 | Ando | |
| 2006/0181195 A1 | 8/2006 | Oikawa et al. | |
| 2012/0192009 A1* | 7/2012 | Chang | G06F 11/2221 |
| | | | 714/27 |
| 2012/0229408 A1 | 9/2012 | Yamamoto | |
| 2014/0225444 A1* | 8/2014 | Yoshidomi | H02H 3/16 |
| | | | 307/78 |
| 2014/0239967 A1* | 8/2014 | Towers | G01R 31/025 |
| | | | 324/509 |
| 2014/0239968 A1* | 8/2014 | Ishii | H01L 31/02021 |
| | | | 324/509 |
| 2014/0253138 A1* | 9/2014 | Ishii | H02H 3/16 |
| | | | 324/509 |
| 2014/0306713 A1* | 10/2014 | Ambo | G01R 31/024 |
| | | | 324/509 |
| 2015/0226781 A1* | 8/2015 | Sun | G01R 31/088 |
| | | | 702/59 |

FOREIGN PATENT DOCUMENTS

| | | |
|---|---|---|
| JP | 63-261414 A | 10/1988 |
| JP | 3-149610 A | 6/1991 |
| JP | 3-198121 A | 8/1991 |
| JP | 2005-345546 A | 12/2005 |
| WO | 2011/080861 A1 | 7/2011 |

* cited by examiner

FIG. 2

INPUTS TO MONITORING SIGNAL LINES DURING NORMAL PERIOD
(IN ORDER OF XCOMD2, XCOMD1, AND XCOMD0)

| NON-SCAN PERIOD | SCAN PERIOD : COMMON SIGNAL LINE TO BE DRIVEN | | | | | | |
|---|---|---|---|---|---|---|---|
| | XCOM1 | XCOM2 | XCOM3 | XCOM4 | XCOM5 | XCOM6 | XCOM7 |
| 000 | 001 | 010 | 011 | 100 | 101 | 110 | 111 |

FIG. 3

INPUTS TO MONITORING SIGNAL LINES DURING NON-SCAN PERIOD
(STATE WHERE NONE OF COMMON SIGNAL LINES IS DRIVEN)

| STATES OF COMMON SIGNAL LINES | INPUTS TO MONITORING SIGNAL LINES |
|---|---|
| NORMAL PERIOD | 000 |
| GROUND FAULT ON XCOMD1 | 001 |
| GROUND FAULT ON XCOMD2 | 010 |
| GROUND FAULT ON XCOMD3 | 011 |
| GROUND FAULT ON XCOMD4 | 100 |
| GROUND FAULT ON XCOMD5 | 101 |
| GROUND FAULT ON XCOMD6 | 110 |
| GROUND FAULT ON XCOMD7 | 111 |

FIG. 4   INPUTS TO MONITORING SIGNAL LINES DURING SCAN PERIOD WHEN GROUND FAULT HAS OCCURRED ON COMMON SIGNAL LINES

| STATES OF COMMON SIGNAL LINES | COMMON SIGNAL LINE TO BE DRIVEN | | | | | | |
|---|---|---|---|---|---|---|---|
| | XCOM1 | XCOM2 | XCOM3 | XCOM4 | XCOM5 | XCOM6 | XCOM7 |
| NORMAL VALUE | 001 | 010 | 011 | 100 | 101 | 110 | 111 |
| GROUND FAULT ON XCOMD1 | 001 | 011 | 011 | 101 | 101 | 111 | 111 |
| GROUND FAULT ON XCOMD2 | 011 | 010 | 011 | 110 | 111 | 110 | 111 |
| GROUND FAULT ON XCOMD3 | 011 | 011 | 011 | 111 | 111 | 111 | 111 |
| GROUND FAULT ON XCOMD4 | 101 | 110 | 111 | 100 | 101 | 110 | 111 |
| GROUND FAULT ON XCOMD5 | 101 | 111 | 111 | 101 | 101 | 111 | 111 |
| GROUND FAULT ON XCOMD6 | 111 | 110 | 111 | 110 | 111 | 110 | 111 |
| GROUND FAULT ON XCOMD7 | 111 | 111 | 111 | 111 | 111 | 111 | 111 |

FIG. 5   INPUTS TO MONITORING SIGNAL LINES DURING SCAN PERIOD WHEN SHORT CIRCUIT HAS OCCURRED ON COMMON SIGNAL LINES

| STATES OF COMMON SIGNAL LINES | COMMON SIGNAL LINE TO BE DRIVEN | | | | | | |
|---|---|---|---|---|---|---|---|
| | XCOM1 | XCOM2 | XCOM3 | XCOM4 | XCOM5 | XCOM6 | XCOM7 |
| NORMAL VALUE | 001 | 010 | 011 | 100 | 101 | 110 | 111 |
| GROUND FAULT ON XCOMD1 AND XCOMD2 | 011 | 011 | 011 | 100 | 101 | 110 | 111 |
| GROUND FAULT ON XCOMD2 AND XCOMD3 | 001 | 011 | 011 | 100 | 101 | 110 | 111 |
| GROUND FAULT ON XCOMD3 AND XCOMD4 | 001 | 010 | 111 | 111 | 111 | 110 | 111 |
| GROUND FAULT ON XCOMD4 AND XCOMD5 | 001 | 010 | 011 | 101 | 101 | 110 | 111 |
| GROUND FAULT ON XCOMD5 AND XCOMD6 | 001 | 010 | 011 | 100 | 111 | 111 | 111 |
| GROUND FAULT ON XCOMD6 AND XCOMD7 | 001 | 010 | 011 | 100 | 101 | 111 | 111 |

FIG. 6  INPUTS TO MONITORING SIGNAL LINES DURING SCAN PERIOD WHEN
DISCONNECTION HAS OCCURRED ON COMMON SIGNAL LINES

| STATES OF COMMON | COMMON SIGNAL LINES TO BE DRIVEN | | | | | | |
| SIGNAL LINES | XCOM1 | XCOM2 | XCOM3 | XCOM4 | XCOM5 | XCOM6 | XCOM7 |
|---|---|---|---|---|---|---|---|
| NORMAL VALUE | 001 | 010 | 011 | 100 | 101 | 110 | 111 |
| DISCONNECTION ON XCOM1 | 000 | 010 | 011 | 100 | 101 | 110 | 111 |
| DISCONNECTION ON XCOM2 | 001 | 000 | 011 | 100 | 101 | 110 | 111 |
| DISCONNECTION ON XCOM3 | 001 | 010 | 000 | 100 | 101 | 110 | 111 |
| DISCONNECTION ON XCOM4 | 001 | 010 | 011 | 000 | 101 | 110 | 111 |
| DISCONNECTION ON XCOM5 | 001 | 010 | 011 | 100 | 000 | 110 | 111 |
| DISCONNECTION ON XCOM6 | 001 | 010 | 011 | 100 | 101 | 000 | 111 |
| DISCONNECTION ON XCOM7 | 001 | 010 | 011 | 100 | 101 | 110 | 000 |

FIG. 7  DISPLAY EXAMPLE OF DIAGNOSIS SCREEN

| COMMON SIGNAL LINE | EXPECTED VALUE | MEASURED VALUE |
|---|---|---|
| NO SCAN | 000 | 000 |
| COM1 | 001 | 001 |
| COM2 | 010 | 000 |
| COM3 | 011 | 001 |
| COM4 | 100 | 100 |
| COM5 | 101 | 101 |
| COM6 | 110 | 100 |
| COM7 | 111 | 101 |

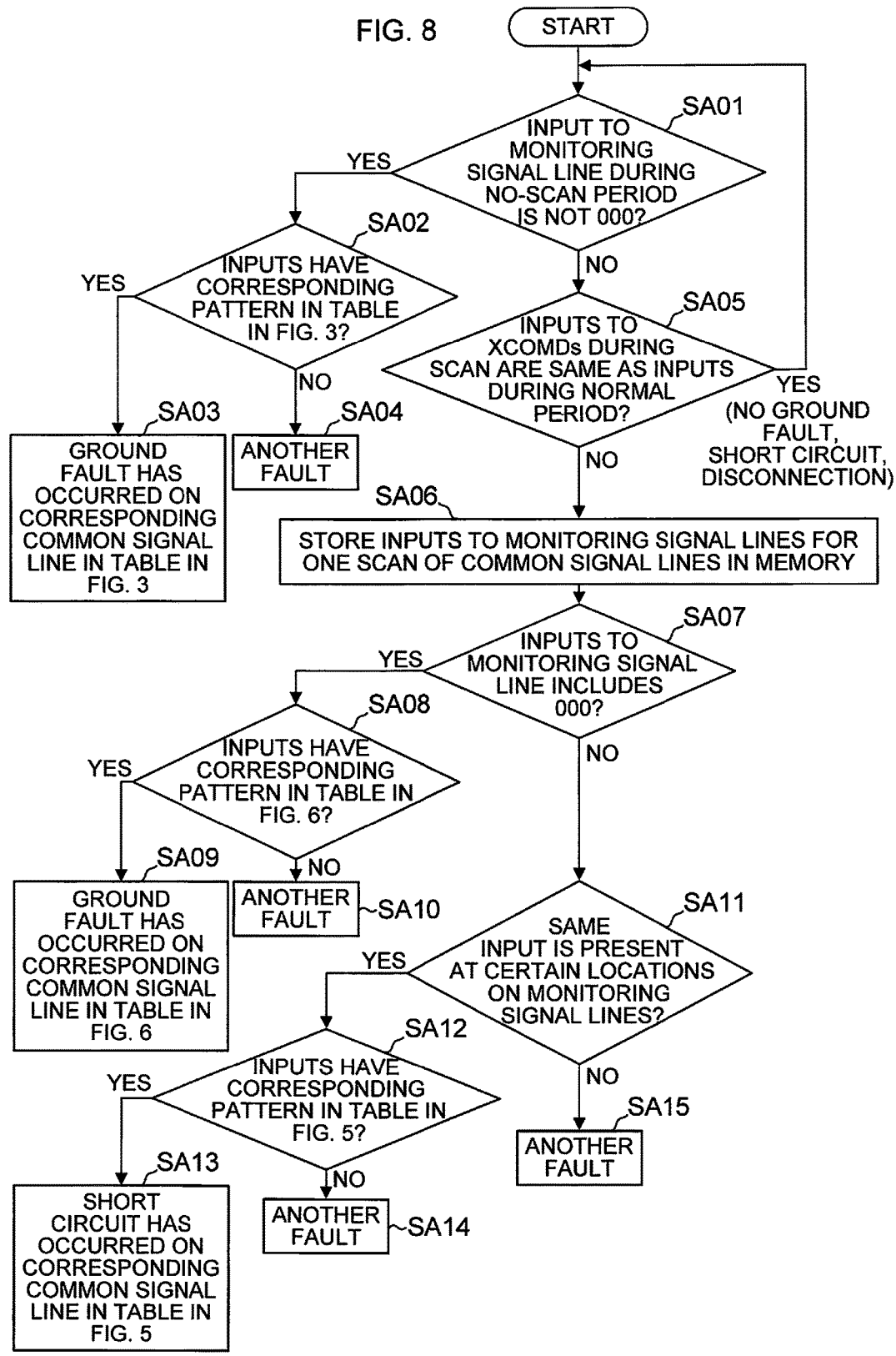

FIG. 10

INPUTS TO MONITORING SIGNAL LINES DURING NON-SCAN PERIOD
(STATE WHERE NONE OF COMMON SIGNAL LINES IS DRIVEN)

| STATES OF COMMON SIGNAL LINES | INPUTS TO MONITORING SIGNAL LINES |
|---|---|
| NORMAL PERIOD | 000 |
| GROUND FAULT ON XCOM1 | 001 |
| GROUND FAULT ON XCOM2 | 010 |
| GROUND FAULT ON XCOM3 | 011 |
| GROUND FAULT ON XCOM4 | 100 |
| GROUND FAULT ON XCOM5 | 101 |
| GROUND FAULT ON XCOM6 | 110 |
| GROUND FAULT ON XCOM7 | 111 |

FIG. 12

INPUTS TO MONITORING SIGNAL LINES DURING NORMAL PERIOD
(IN ORDER OF COMD2, COMD1, AND COMD0)

| NON-SCAN PERIOD | SCAN PERIOD: COMMON SIGNAL LINE TO BE DRIVEN | | | | | | |
|---|---|---|---|---|---|---|---|
| | COM1 | COM2 | COM3 | COM4 | COM5 | COM6 | COM7 |
| 000 | 001 | 010 | 011 | 100 | 101 | 110 | 111 |

FIG. 13  INPUTS TO MONITORING SIGNAL LINES DURING SCAN PERIOD WHEN GROUND FAULT OR DISCONNECTION HAS OCCURRED ON COMMON SIGNAL LINES

| STATES OF COMMON SIGNAL LINES | COMMON SIGNALS TO BE DRIVEN | | | | | | |
|---|---|---|---|---|---|---|---|
| | COM1 | COM2 | COM3 | COM4 | COM5 | COM6 | COM7 |
| NORMAL VALUE | 001 | 010 | 011 | 100 | 101 | 110 | 111 |
| GROUND FAULT OR DISCONNECTION ON COM1 | 000 | 010 | 011 | 100 | 101 | 110 | 111 |
| GROUND FAULT OR DISCONNECTION ON COM2 | 001 | 000 | 011 | 100 | 101 | 110 | 111 |
| GROUND FAULT OR DISCONNECTION ON COM3 | 001 | 010 | 000 | 100 | 101 | 110 | 111 |
| GROUND FAULT OR DISCONNECTION ON COM4 | 001 | 010 | 011 | 000 | 101 | 110 | 111 |
| GROUND FAULT OR DISCONNECTION ON COM5 | 001 | 010 | 011 | 100 | 000 | 110 | 111 |
| GROUND FAULT OR DISCONNECTION ON COM6 | 001 | 010 | 011 | 100 | 101 | 000 | 111 |
| GROUND FAULT OR DISCONNECTION ON COM7 | 001 | 010 | 011 | 100 | 101 | 110 | 000 |

FIG. 14  INPUTS TO MONITORING SIGNAL LINES DURING SCAN PERIOD WHEN SHORT CIRCUIT HAS OCCURRED ON COMMON SIGNAL LINES

| STATES OF COMMON SIGNAL LINES | COMMON SIGNALS TO BE DRIVEN | | | | | | |
|---|---|---|---|---|---|---|---|
| | COM1 | COM2 | COM3 | COM4 | COM5 | COM6 | COM7 |
| NORMAL VALUE | 001 | 010 | 011 | 100 | 101 | 110 | 111 |
| SHORT CIRCUIT ON COM1 AND COM2 | 011 | 011 | 011 | 100 | 101 | 110 | 111 |
| SHORT CIRCUIT ON COM2 AND COM3 | 001 | 011 | 011 | 100 | 101 | 110 | 111 |
| SHORT CIRCUIT ON COM3 AND COM4 | 001 | 010 | 111 | 111 | 101 | 110 | 111 |
| SHORT CIRCUIT ON COM4 AND COM5 | 001 | 010 | 011 | 101 | 111 | 110 | 111 |
| SHORT CIRCUIT ON COM5 AND COM6 | 001 | 010 | 011 | 100 | 101 | 111 | 111 |
| SHORT CIRCUIT ON COM6 AND COM7 | 001 | 010 | 011 | 100 | 101 | 111 | 111 |

DISPLAY EXAMPLE OF DIAGNOSIS SCREEN

| COMMON SIGNAL LINE | EXPECTED VALUE | MEASURED VALUE |
|---|---|---|
| NO SCAN | 000 | 000 |
| COM1 | 001 | 001 |
| COM2 | 010 | 000 |
| COM3 | 011 | 001 |
| COM4 | 100 | 100 |
| COM5 | 101 | 101 |
| COM6 | 110 | 100 |
| COM7 | 111 | 101 |

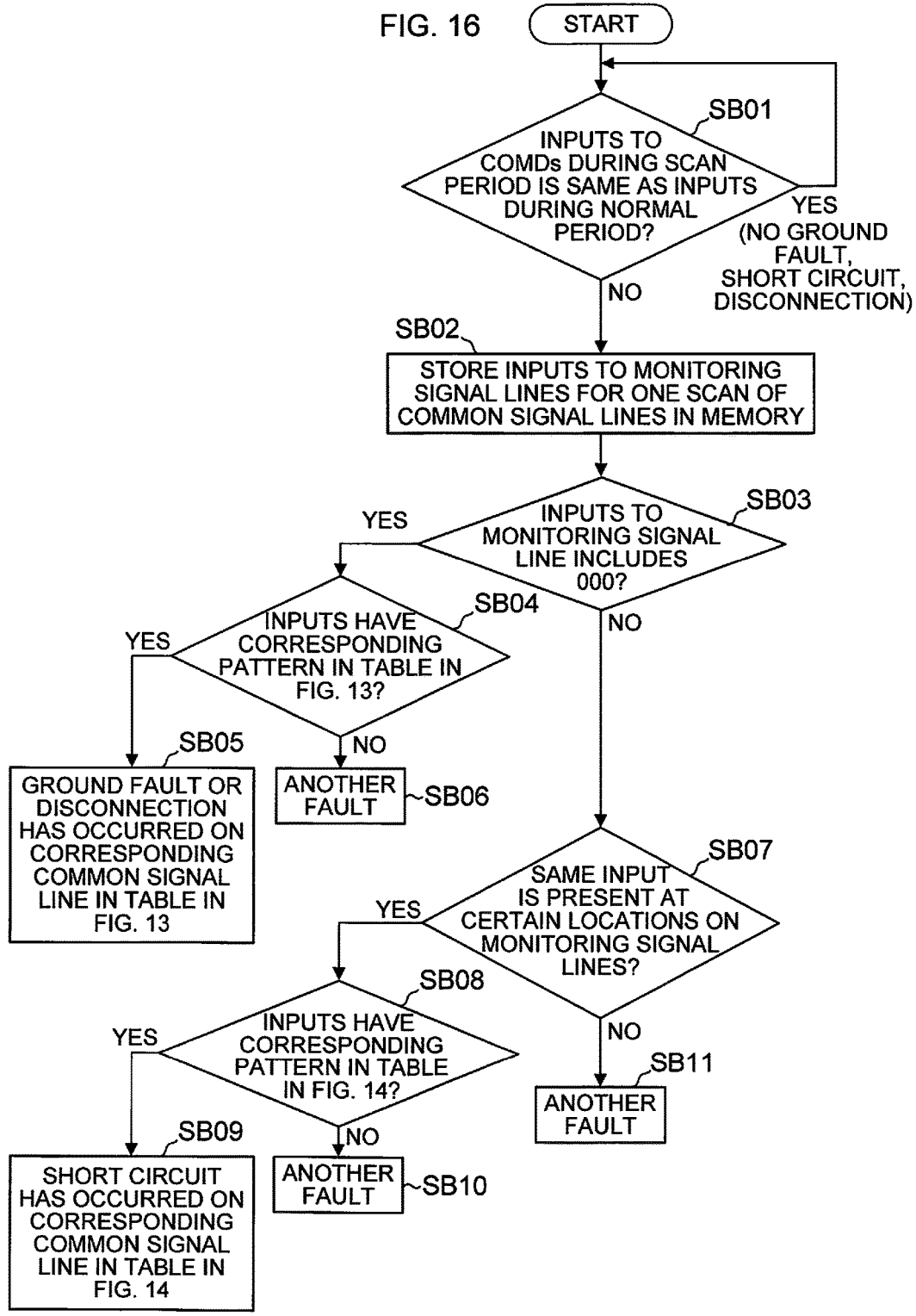

MATRIX CIRCUIT DETECTING FAILURE LOCATION IN COMMON SIGNAL

RELATED APPLICATIONS

The present application claims priority to Japanese Application Number 2014-257498, filed Dec. 19, 2014, the disclosure of which is hereby incorporated by reference herein in its entirety.

BACKGROUND OF THE INVENTION

1. Field of the Invention

The present invention relates to a matrix circuit that detects a fault location in a common signal.

2. Description of the Related Art

An input apparatus using a matrix circuit is well known. As an example of such an input apparatus, a circuit for a keyboard using a general sinking matrix circuit as disclosed in Japanese Patent Application Laid-open No. S61-058025 will be described with reference to FIG. 17.

In a general sinking matrix circuit, common signal lines (XCOM) and data signal lines (XKEYD) are arranged like a lattice, with key switches arranged on these lines. An example in FIG. 17 is a sinking matrix circuit with seven common signal lines and eight data signal lines. The matrix circuit allows detection of inputs (key information) the number of which results from multiplication of the number of common signal lines by the number of data signal lines. Thus, in this circuit allows information on 56 keys to be detected. Diodes in FIG. 17 are connected together in order to prevent signals from sneaking when a plurality of key are depressed.

The key information is scanned using an ASIC or the like to drive the common signal lines in order to allow data on the data signal lines to be loaded. When a key is depressed, the common signal line to which the key is connected is driven to enable bits on the data signal line to which the key is connected, allowing the depression of the key to be recognized. For example, in FIG. 17, when a circled key switch is depressed, a common signal line XCOM2 to which the key switch is connected is driven to enable a data signal line XKEYD4. This is detected to allow the depression of the key switch at the corresponding position to be recognized.

The circuit in FIG. 17 is a sink circuit, and the common signal line is scanned by being driven low. At this time, when a data signal is low, the corresponding key switch is determined to have been depressed. Some matrix circuits are of a source type. In a sourcing matrix circuit, the common signal line is scanned by being driven high. A high input to the data signal line allows depression of the key to be recognized.

The matrix circuit allows a large amount of input information to be obtained using a smaller number of signal lines. However, a possible ground fault, short-circuit, or disconnection on the common signal lines and the data signal lines causes an erroneous input to be detected, leading to malfunction. Thus, whether a ground fault, a short-circuit, or disconnection has occurred or not and the location of the occurrence need to be determined.

When a fault occurs on the data signal lines, a phenomenon resulting from the fault and an occurrence condition for the phenomenon other than the fault on the data line are as follows.

<Ground Fault on the Data Signal Line>
Phenomenon: all the keys connected to the data line on which a ground fault has occurred are input even when the keys are not depressed.
Failure portion on the data signal lines: the data signal line to which the input keys are connected
Cause of a fault on the common signal line leading to the phenomenon: none <Short Circuit on the Data Signal Line>
Phenomenon: depressing one key causes another short-circuited key to be input.
Failure portion on the data signal lines: the data signal line to which the two input keys are connected
Cause of a fault on the common signal line leading to the phenomenon: a short circuit on the common signal line <Disconnection of the Data Signal Line>
Phenomenon: nothing is input in spite of depression of a key.
Failure portion on the data signal lines: the data signal line to which the key that has failed to be input is connected.
Cause of a fault on the common signal line leading to the phenomenon: disconnection of the common signal line As described above, when a fault occurs on any data signal line, the location of the fault on the data signal lines can be relatively easily detected if the fault is determined not to have been caused by any common signal line. However, when a fault occurs on any common signal line, the location of the fault disadvantageously fails to be easily detected depending on the contents of the fault.

SUMMARY OF THE INVENTION

An object of the present invention is to provide a matrix circuit that enables determination of the cause of a fault occurring on common signal lines and the location of the fault.

A first aspect of a matrix circuit according to the present invention is a matrix circuit of a sink type having m (m is a natural number) common signal lines and n (n is a natural number) data signal lines, the common signal lines and the data signal lines being arranged in a matrix, and m×n switches each connected between the common signal line and the data signal line intersecting each other, the matrix circuit being configured such that states of keys are scanned by driving the common signal lines to a low level one by one while reading states of the data signal lines, the matrix circuit having p (p is a natural number) monitoring signal lines that allow states of the common signal lines to be monitored, a storage unit in which inputs to the monitoring signal lines during one scan of the common signal lines are stored, and a detection unit that detects occurrence of a fault including a ground fault, a short circuit, or disconnection on any of the common signal lines to identify the faulty common signal line.

When a ground fault has occurred on any of the common signal lines, the detection unit may determine that a ground fault has occurred on the common signal line when all of the inputs to the monitoring signal lines are not 0 or at a high level during a non-scan period when none of the common signal lines are driven, and determine a location of the ground fault on the common signal line based on data input to the monitoring signal lines.

When a ground fault has occurred on any of the common signal lines, the detection unit may detect occurrence of a fault on the common signal line and store the inputs to the monitoring signal lines for one scan in the storage unit when the inputs to the monitoring signal lines during the scan are different from the inputs to the monitoring signal lines during a normal period, further determine that the fault on the common signal line is a ground fault when the stored inputs to the monitoring signal lines are constantly 1 (low level), and determine a location of the ground fault on the common signal line based on data input to the monitoring signal lines and stored in the storage unit.

When a short circuit has occurred on any of the common signal lines, the detection unit may detect occurrence of a fault on the common signal line and store the inputs to the monitoring signal lines for one scan in the storage unit when the inputs to the monitoring signal lines during the scan are different from the inputs to the monitoring signal lines during a normal period, further determine that the fault on the common signal line is a short circuit when the stored inputs to the monitoring signal lines are the same as the inputs to the monitoring signal lines during a different scan of the common signal lines, and determine a location of the short circuit on the common signal line based on data input to the monitoring signal lines and stored in the storage unit.

When disconnection has occurred on any of the common signal lines, the detection unit may detect occurrence of a fault on the common signal line and store the inputs to the monitoring signal lines for one scan in the storage unit when the inputs to the monitoring signal lines during the scan are different from the inputs to the monitoring signal lines during a normal period, further determine that the fault on the common signal line is disconnection when all of the stored inputs to the monitoring signal line are 0 (high level) and determine a location of the disconnection on the common signal line based on data input to the monitoring signal lines and stored in the storage unit.

In the matrix circuit, the inputs to the monitoring signal lines during a non-scan period and during a scan period may be output to a display unit when the fault occurs.

A second aspect of a matrix circuit according to the present invention is a matrix circuit of a sink type having m (m is a natural number) common signal lines and n (n is a natural number) data signal lines, the common signal lines and the data signal lines being arranged in a matrix, and m×n switches each connected between the common signal line and the data signal line intersecting each other, the matrix circuit being configured such that states of keys are scanned by driving the common signal lines to a low level one by one while reading states of the data signal lines, the matrix circuit having p (p is a natural number) monitoring signal lines that allow states of the common signal lines to be monitored, and a detection unit that detects a ground fault on any of the common signal lines and that identifies the common signal line on which the ground fault has occurred.

When a ground fault has occurred on any of the common signal lines, the detection unit may determine that a ground fault has occurred on the common signal line when all of the inputs to the monitoring signal lines are not 0 or at a high level during a non-scan period when none of the common signal lines are driven, and determine a location of the ground fault on the common signal line based on data input to the monitoring signal lines.

In the matrix circuit, the inputs to the monitoring signal lines during a non-scan period may be output to a display unit when the fault occurs.

A third aspect of a matrix circuit according to the present invention is a matrix circuit of a source type having m (m is a natural number) common signal lines and n (n is a natural number) data signal lines, the common signal lines and the data signal lines being arranged in a matrix, and m×n switches each connected between the common signal line and the data signal line intersecting each other, the matrix circuit being configured such that states of keys are scanned by driving the common signal lines to a high level one by one while reading states of the data signal lines, the matrix circuit having p (p is a natural number) monitoring signal lines that allow states of the common signal lines to be monitored, a storage unit in which inputs to the monitoring signal lines during one scan of the common signal lines are stored, and a detection unit that detects occurrence of a fault including a ground fault, a short circuit, or disconnection on any of the common signal lines to identify the faulty common signal line.

When a short circuit has occurred on any of the common signal lines, the detection unit may detect occurrence of a fault on the common signal line and store the inputs to the monitoring signal lines for one scan in the storage unit when the inputs to the monitoring signal lines during the scan are different from the inputs to the monitoring signal lines during a normal period, further determine that the fault on the common signal line is a short circuit when the stored inputs to the monitoring signal lines are the same as the inputs to the monitoring signal lines during a different scan of the common signal lines, and determine a location of the short circuit on the common signal line based on data input to the monitoring signal lines and stored in the storage unit.

In the matrix circuit, the inputs to the monitoring signal lines during a non-scan period and during a scan period are output to a display unit when the fault occurs.

When a ground fault or disconnection has occurred on any of the common signal lines, the detection unit may detect occurrence of a fault on the common signal line and store the inputs to the monitoring signal lines for one scan in the storage unit when the inputs to the monitoring signal lines during the scan are different from the inputs to the monitoring signal lines during a normal period, further determine that the fault on the common signal line is a ground fault or disconnection when all of the stored inputs to the monitoring signal line are 0 (high level), and determine a location of the ground fault or the disconnection on the common signal line based on data input to the monitoring signal lines and stored in the storage unit.

According to the present invention, the p (p is a natural number) monitoring signal lines (XCOMD0 to XCOMDp−1) are added to the common signal lines in the matrix circuit such that the inputs to the monitoring signal lines during sequential scan of all of the common signals are stored and analyzed. This enables detection of occurrence of a ground fault, a short circuit, or disconnection on the common signal lines and identification of the faulty common signal line, which are impossible with the related art.

BRIEF DESCRIPTION OF THE DRAWINGS

The forgoing and other objects and features of the present invention will be apparent from the following description of preferred embodiments of the invention with reference to the accompanying drawings, in which:

FIG. 2 is a table illustrating inputs to monitoring signal lines in the matrix circuit in FIG. 1 during a normal period;

FIG. 3 is a table illustrating inputs to the monitoring signal lines in the matrix circuit in FIG. 1 during a non-scan period when a ground fault has occurred;

FIG. 4 is a table illustrating inputs to the monitoring signal lines in the matrix circuit in FIG. 1 during a scan period when a ground fault has occurred;

FIG. 5 is a table illustrating inputs to the monitoring signal lines in the matrix circuit in FIG. 1 during a scan period when a ground fault has occurred;

FIG. 6 is a table illustrating inputs the monitoring signal lines in the matrix circuit in FIG. 1 during a scan period when disconnection has occurred;

FIG. 7 is a diagram illustrating a display example of a diagnosis screen of the matrix circuit in FIG. 1;

FIG. 8 is a flowchart of a fault diagnosis process by the matrix circuit in FIG. 1;

FIG. 10 is a is a table illustrating inputs to monitoring signal lines in the matrix circuit in FIG. 9 during a non-scan period when a ground fault has occurred;

FIG. 12 is a table illustrating inputs to monitoring signal lines in the matrix circuit in FIG. 11 during a normal period;

FIG. 13 is a table illustrating inputs to the monitoring signal lines in the matrix circuit in FIG. 11 during a scan period when a ground fault or disconnection has occurred;

FIG. 14 is a table illustrating inputs to the monitoring signal lines in the matrix circuit in FIG. 11 during a scan period when a short circuit has occurred;

FIG. 16 is a flowchart of a fault diagnosis process by the matrix circuit in FIG. 11.

DESCRIPTION OF THE PREFERRED EMBODIMENTS

First, a first embodiment of a matrix circuit according to the present invention will be described using FIGS. 1 to 8.

Figure 1:
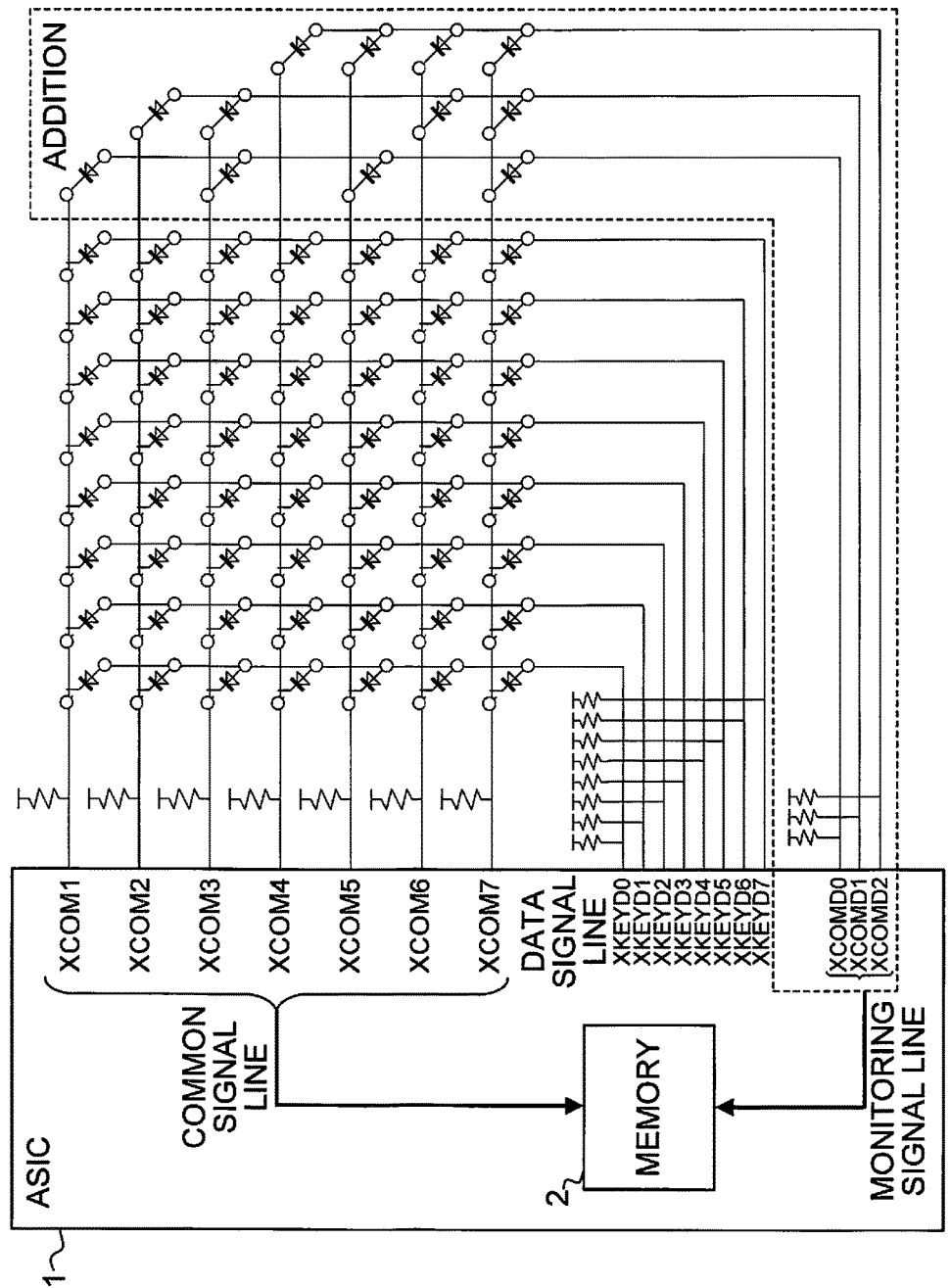
FIG. 1 is a diagram of a configuration of a first embodiment of a matrix circuit according to the present invention.

FIG. 1 is a diagram depicting the matrix circuit according to the first embodiment of the present invention.

The matrix circuit according to the present embodiment is a sinking matrix circuit with seven common signal lines (XCOMs, XCOM1 to XCOM7) and eight data signal lines (XKEYDs, XKEYD0 to XKEYD7). The matrix circuit depicted in FIG. 1 corresponds to a general sinking matrix circuit to which monitoring signal lines (XCOMD) are added.

In the present embodiment, the monitoring signal lines are connected so as to convert data on the common signal lines into binary codes, allowing the seven common signal lines to be monitored by the three monitoring signal lines, XCOMD2, the XCOMD1, and the XCOMD0. In the matrix circuit depicted in FIG. 1, diodes are assembled in the circuit in order to prevent possible sneaking of signals. In scan processing, the common signal lines are driven to allow key information to be loaded through the data signal lines. At this time, inputs to the monitoring signal lines are loaded to allow the states of the common signal lines to be monitored.

A table in FIG. 2 indicates inputs to the monitoring signal lines during a normal period. Three-digit binary values in the table represent values for the XCOMD2, the XCOMD1, and the XCOMD0 in accordance with negative logic (low input is represented as 1, and high input is represented as 0) and are arranged in order. During a non-scan period when none of the common signal lines is driven, "000" is input to the monitoring signal lines. During a scan period when the common signal lines are driven in order, signals with the binarized numbers of the common signal lines being driven are input through the monitoring signal lines.

In the matrix circuit configured as depicted in FIG. 1, when a fault such as a ground fault, a short-circuit, or disconnection occurs on the common signal lines, the inputs to the monitoring signal lines are detected which are different from inputs to the monitoring signal lines during the normal period indicated in the table in FIG. 2. When inputs different from the inputs during the normal period are detected, the inputs for one scan are stored in a memory 2 provided in an ASIC 1 and used to determine the location of the fault. A method for detecting the location of a fault will be described below for each cause of the fault.

<1.1 Method for Detecting the Location of a Ground Fault on the Common Signal Lines>

A table in FIG. 3 indicates input values input to the monitoring signal lines during the non-scan period (state where none of the common signal lines is driven).

As indicated in the table in FIG. 3, when the common signal lines are normal, a value "000" is input through the signal lines during the non-scan period. However, when a ground fault occurs on any of the common signal lines, 1 (low level) is detected in some of the monitoring signal lines during the non-scan period when none of the common signal lines is driven. As in the table in FIG. 3, the inputs to the monitoring signal lines each indicate the number of the common signal line on which a ground fault has occurred.

A table in FIG. 4 illustrates another detection method used when a ground fault has occurred on the common signal lines.

The table in FIG. 4 indicates input values input to the monitoring signal lines when a ground fault has occurred on any of the common signal lines. When a ground fault occurs on the common signal lines, a signal with a value fixed to 1 is observed in the inputs to the monitoring signal lines during a scan period. In this case, the location of the ground fault can be determined by performing an AND operation on data on the monitoring signal lines for one scan. For example, when a ground fault occurs on the common signal line XCOM3, the data for one scan is "011", "011", "011", "111", "111", "111", and "111". Performing an AND operation on all of these values results in "011", whereby it is possible to determine that a ground fault has occurred on the common signal line XCOM3.

<1.2 Method for Detecting the Location of a Short Circuit on the Common Signal Lines>

A table in FIG. 5 indicates input values input to the monitoring signal lines when a short circuit occurs on the common signal lines. When a short circuit occurs on the common signal lines, the same input is detected at two or three locations on the monitoring signal lines.

When the same input is detected at two locations, a short circuit has occurred on common signal lines being driven when the same input is detected. For example, when the common signal line XCOM2 and the common signal line XCOM3 are short-circuited, a pattern in which both common signal lines involve the input "011" is detected at two locations. The common signal lines XCOM2 and XCOM3 being driven when the same input is detected at the two locations are determined to be the locations of the short circuit.

When the same input is detected at three locations, a short circuit has occurred at two locations other than the common signal line indicated by the input (the common signal line for which, during the normal period, the input is detected through the monitoring signal lines when the common signal line is driven). For example, when the XCOM3 and the XCOM4 are short-circuited, the input of "111" is detected at three locations. In this case, the common signal lines indicated by "111" other than the XCOM7, that is, the XCOM3 and the XCOM4, are the locations of the short circuit.

The table in FIG. 5 indicates only the short circuits on the adjacent signals. However, when a short circuit is likely to occur on any other combination of common signal lines, the combination may be added to the table in FIG. 5 and used to detect the short circuit.

<1.3 Method for Detecting the Location of Disconnection on the Common Signal Lines>

A table in FIG. 6 indicates input values input to the monitoring signal lines when disconnection occurs on the common signal lines. When disconnection occurs on the common signal lines, the inputs to the monitoring signal lines are "000" when the common signal line on which disconnection has occurred is driven. The common signal line being driven when "000" is detected in the inputs to the monitoring signal line can be detected as the location of disconnection.

<1.4 Screen Display of the Monitoring Signal Lines>

The states of the monitoring signal lines saved in the memory 2 can be displayed on a diagnosis screen along with values expected to be detected through the monitoring signal lines during the normal period. FIG. 7 depicts a display example of the diagnosis screen. When the common signal lines to be driven, the values expected to be detected through the monitoring signal lines during the normal period, and measured values detected through the monitoring signal lines are arranged in the screen as depicted in FIG. 7, an operator can determine a failure occurring on the common signal lines.

<1.5 Flowchart of a Fault Diagnosis Process through the Monitoring Signal Lines>

FIG. 8 is a flowchart of a fault diagnosis process using the monitoring signal lines.

[Step SA01] It is determined whether or not the input to each of the monitoring signal lines during the non-scan period for the common signal lines is "000". When the input to the monitoring signal line during the non-scan period for the common signal lines is not "000", the process proceeds to step SA02. When the input to the monitoring signal line during the non-scan period for the common signal lines is "000", the process proceeds to step SA05.

[Step SA02] It is determined whether or not the inputs to the monitoring signal lines during the non-scan period has a corresponding pattern in the table in FIG. 3. When the inputs to the monitoring signal lines during the non-scan period has a corresponding pattern in the table in FIG. 3, the process proceeds to step SA03. When the inputs to the monitoring signal lines during the non-scan period has no corresponding pattern in the table in FIG. 3, the process proceeds to step SA04.

[Step SA03] It is determined that a ground fault has occurred on the corresponding common signal line in the table in FIG. 3.

[Step SA04] It is determined that a fault other than a ground fault, a short circuit, and disconnection has occurred.

[Step SA05] It is determined whether or not the inputs to the monitoring signal lines during a scan of the common signal lines are the same as normal values. When the inputs to the monitoring signal lines during the scan are the same as the normal values, the process returns to step SA01. When the inputs to the monitoring signal lines during the scan are different from the normal values, the process proceeds to step SA06.

[Step SA06] The inputs to the monitoring signal lines during one scan of the common signal lines are stored in the memory.

[Step SA07] It is determined whether or not the inputs to the monitoring signal lines for one scan stored in step SA06 include a value "000". When the inputs to the monitoring signal lines for one scan stored in step SA06 include the value "000", the process proceeds to SA08. When the inputs to the monitoring signal lines for one scan stored in step SA06 do not include the value "000", the process proceeds to SA11.

[Step SA08] It is determined to whether or not the inputs to the monitoring signal lines for one scan stored in step SA06 correspond to any of the patterns in the table in FIG. 6. When the inputs to the monitoring signal lines for one scan stored in step SA06 correspond to one of the patterns in the table in FIG. 6, the process proceeds to step SA09. When the inputs to the monitoring signal lines for one scan stored in step SA06 correspond to none of the patterns in the table in FIG. 6, the process proceeds to step SA10.

[Step SA09] It is determined that disconnection has occurred on the corresponding common signal line in the table in FIG. 6.

[Step SA10] It is determined that a fault other than a ground fault, a short circuit, and disconnection has occurred.

[Step SA11] It is determined whether or not the inputs to the monitoring signal lines for one scan stored in step SA06 are the same at certain locations on the monitoring signal lines. When the inputs to the monitoring signal lines for one scan stored in step SA06 are the same at certain locations on the monitoring signal lines, the process proceeds to step SA12. When the inputs to the monitoring signal lines for one scan stored in step SA06 are not the same at any locations on the monitoring signal lines, the process proceeds to step SA15.

[Step SA12] It is determined whether or not the inputs to the monitoring signal lines for one scan stored in step SA06 correspond to any of the patterns in the table in FIG. 5. When the inputs to the monitoring signal lines for one scan stored in step SA06 correspond to one of the patterns in the table in FIG. 5, the process proceeds to step SA13. When the inputs to the monitoring signal lines for one scan stored in step SA06 correspond to none of the patterns in the table in FIG. 5, the process proceeds to step SA14.

[Step SA13] It is determined that a short circuit has occurred on the corresponding common signal line in the table in FIG. 5.

[Step SA14] It is determined that a fault other than a ground fault, a short circuit, and disconnection has occurred.

[Step SA15] It is determined that a fault other than a ground fault, a short circuit, and disconnection has occurred.

Now, a second embodiment of the matrix circuit according to the present invention will be described using FIG. 9 and FIG. 10.

Figure 9:
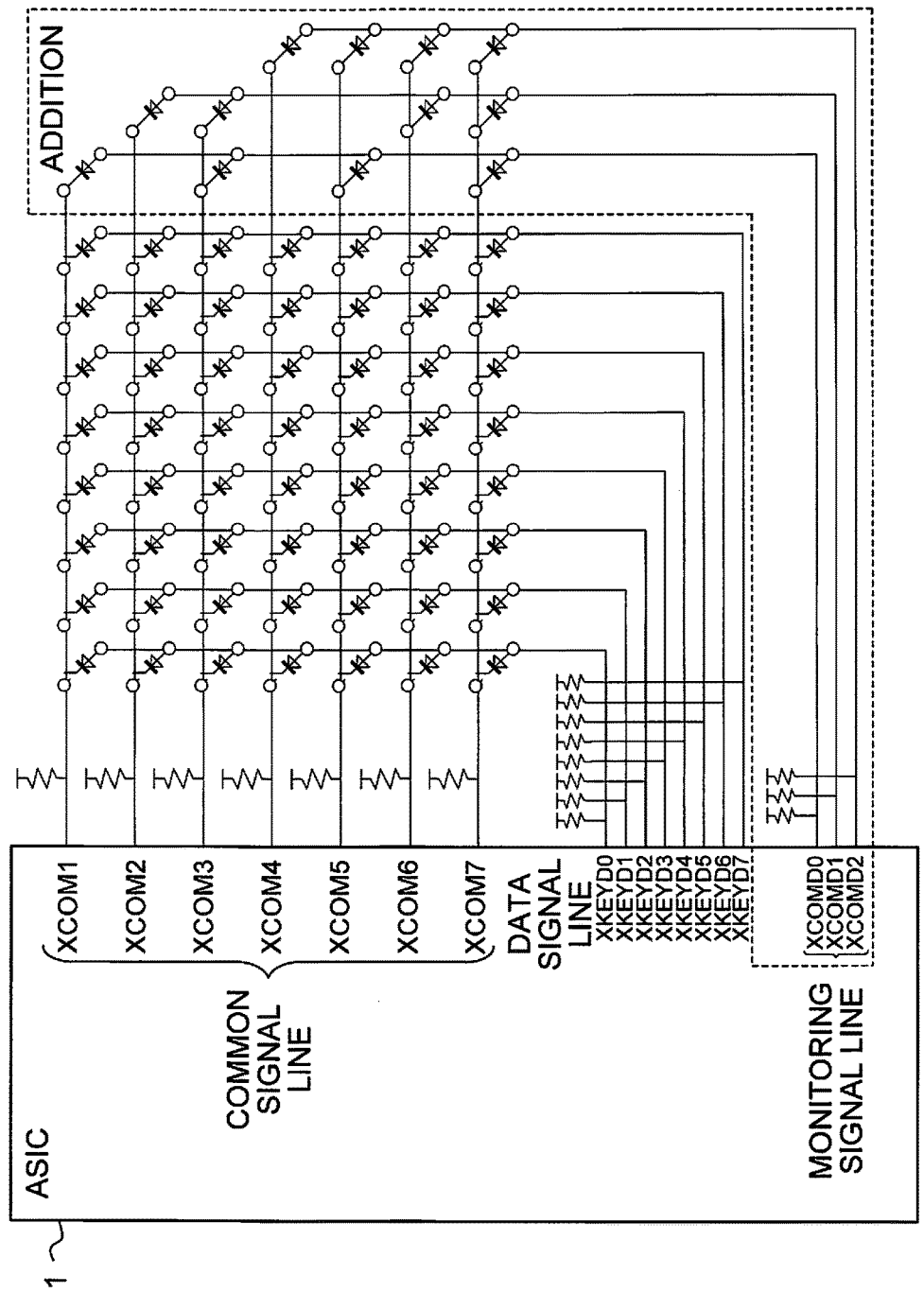
FIG. 9 is a diagram of a configuration of a second embodiment of the matrix circuit according to the present invention.

FIG. 9 is a diagram depicting a matrix circuit according to the second embodiment of the present invention.

The matrix circuit according to the present embodiment is a sinking matrix circuit with seven common signal lines (XCOMs, XCOM1 to XCOM7) and eight data signal lines (XKEYDs, XKEYD0 to XKEYD7). Unlike in the first embodiment, the matrix circuit depicted in FIG. 9 limits the fault location detection target to ground faults only and implements detection of a ground fault using only input signals input through the monitoring signal lines (XCOMD). In the matrix circuit in FIG. 9, diodes are assembled in the circuit in order to prevent sneaking of signals.

During the non-scan period when none of the common signal lines is driven, "000" is detected in the inputs to the monitoring signal lines during the normal period. However, when a ground fault occurs, any of the inputs to the monitoring signal lines exhibits a value other than "000" as illustrated in the table in FIG. 10. Thus, monitoring the monitoring signal lines allows detection of occurrence of a ground fault on the common signal lines.

Now, a third embodiment of the matrix circuit according to the present invention will be described using FIGS. 11 to 16.

Figure 11:
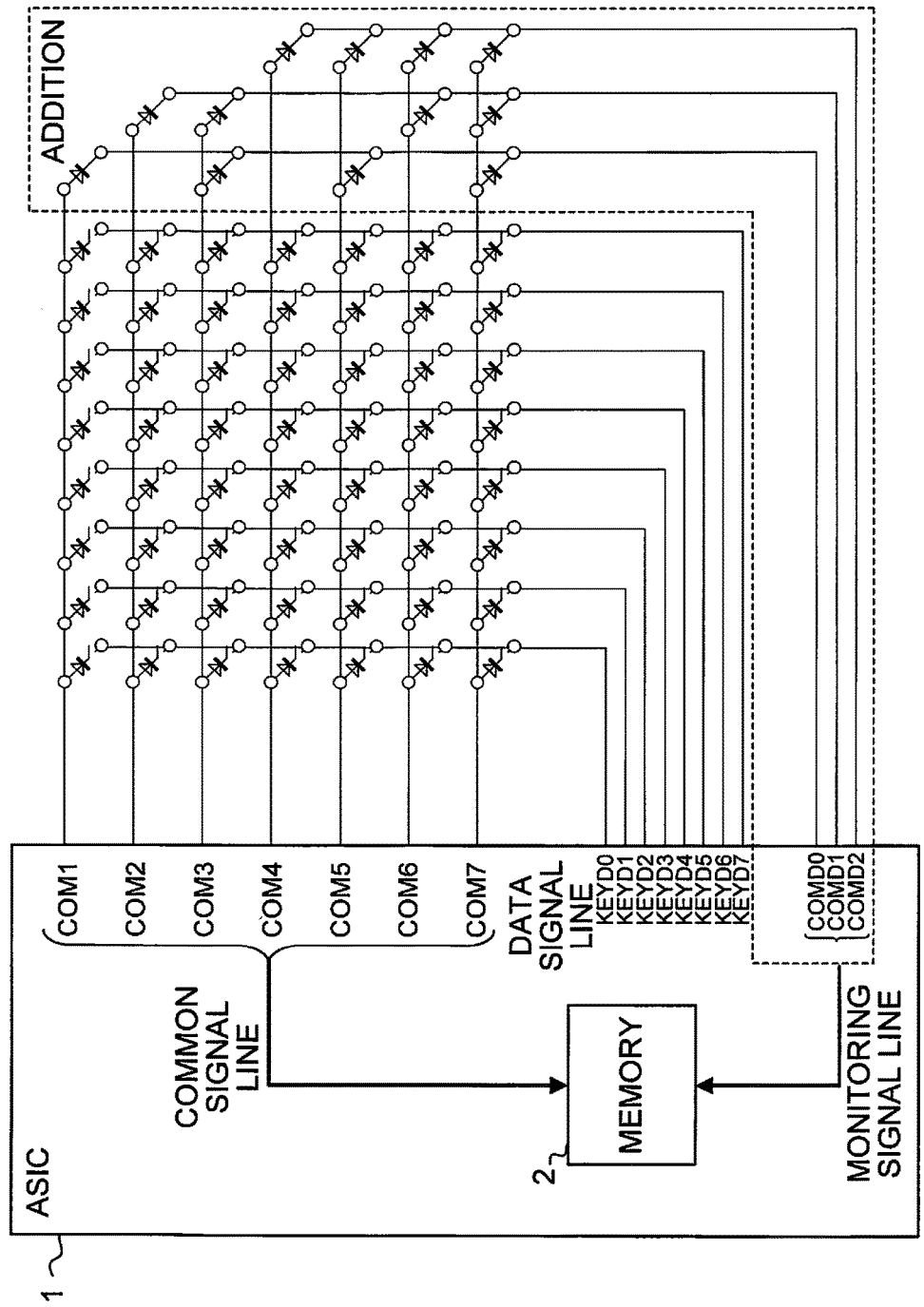
FIG. 11 is a diagram of a configuration of the second embodiment of the matrix circuit according to the present invention.

FIG. 11 is a diagram depicting a matrix circuit according to the third embodiment of the present invention.

The matrix circuit according to the present embodiment is a sourcing matrix circuit with seven common signal lines (COMs, COM1 to COM7) and eight data signal lines (KEYDs, KEYD0 to KEYD7). The matrix circuit depicted in FIG. 11 corresponds to a general sinking matrix circuit to which monitoring signal lines (COMD) are added.

In the present embodiment, the monitoring signal lines are connected so as to convert data on the common signal lines into binary codes, allowing seven common signal lines to be monitored using three monitoring signal lines COMD2, COMD1, and COMD0. In the matrix circuit in FIG. 11, diodes are assembled in the circuit in order to prevent sneaking of signals. In scan processing, the common signal lines are driven to allow key information to be loaded through the data signal lines. At this time, the inputs to the monitoring signal lines are loaded to allow the states of the common signal lines to be monitored.

A table in FIG. 12 indicates inputs to the monitoring signal lines during the normal period. Three-digit binary values in the table represent values for the COMD2, the COMD1, and the COMD0 in accordance with positive logic (low input is represented as 0, and high input is represented as 1) and are arranged in order. During the non-scan period when none of the common signal lines is driven, "000" is input to the monitoring signal lines. During the scan period when the common signal lines are driven in order, signals with the binarized numbers of the common signal lines being driven are input through the monitoring signal lines.

In the matrix circuit configured as depicted in FIG. 11, when a fault such as a ground fault, a short-circuit, or disconnection occurs on the common signal lines, inputs to the monitoring signal lines are detected which are different from the inputs to the monitoring signal lines during the normal period indicated in the table in FIG. 12. When inputs different from the inputs during the normal period are detected, the inputs for one scan are stored in the memory 2 provided in the ASIC 1 and used to determine the location of the fault. A method for detecting the location of a fault will be described below for each cause of the fault.

<3.1 Method for Detecting the Location of a Ground Fault or Disconnection on the Common Signal Lines>

A table in FIG. 13 indicates input values input to the monitoring signal lines when a ground fault or disconnection occurs on the common signal lines.

When a ground fault or disconnection occurs on any of the common signal lines, the inputs to corresponding monitoring signal lines exhibit "000" when the faulty common signal line is driven. Therefore, the common signal line being driven when "000" is detected in the inputs to the monitoring signal line is determined to be the location of the ground fault or disconnection.

<3.2 Method for Detecting the Location of a Short Circuit on the Common Signal Lines>

A table in FIG. 14 indicates input values input to the monitoring signal lines when a short circuit occurs on the common signal lines.

When a short circuit occurs on the common signal lines, the same input is detected at two or three locations on the monitoring signal lines.

When the same input is detected at two locations, a short circuit has occurred on common signal lines being driven. For example, when the common signal line COM2 and the common signal line COM3 are short-circuited, the input "011" is detected at two locations. The common signal lines COM2 and COM3 being driven when the same input is detected at the two locations are determined to be the locations of the short circuit.

When the same input is detected at three locations, a short circuit has occurred at two locations other than the common signal line indicated by the input (the common signal line for which, during the normal period, the input is detected through the monitoring signal lines when the common signal line is driven). For example, when the COM3 and the COM4 are short-circuited, the input of "111" is detected at three locations. In this case, the common signal lines indicated by "111" other than the COM7, that is, the COM3 and the COM4, are the locations of the short circuit.

The table in FIG. 14 indicates only the short circuits on the adjacent signals. However, when a short circuit is likely to occur on any other combination of common signal lines, the combination may be added to the table in FIG. 14 and used to detect the short circuit.

<3.3 Screen Display of the Monitoring Signal Lines>

Figures 15, 17:
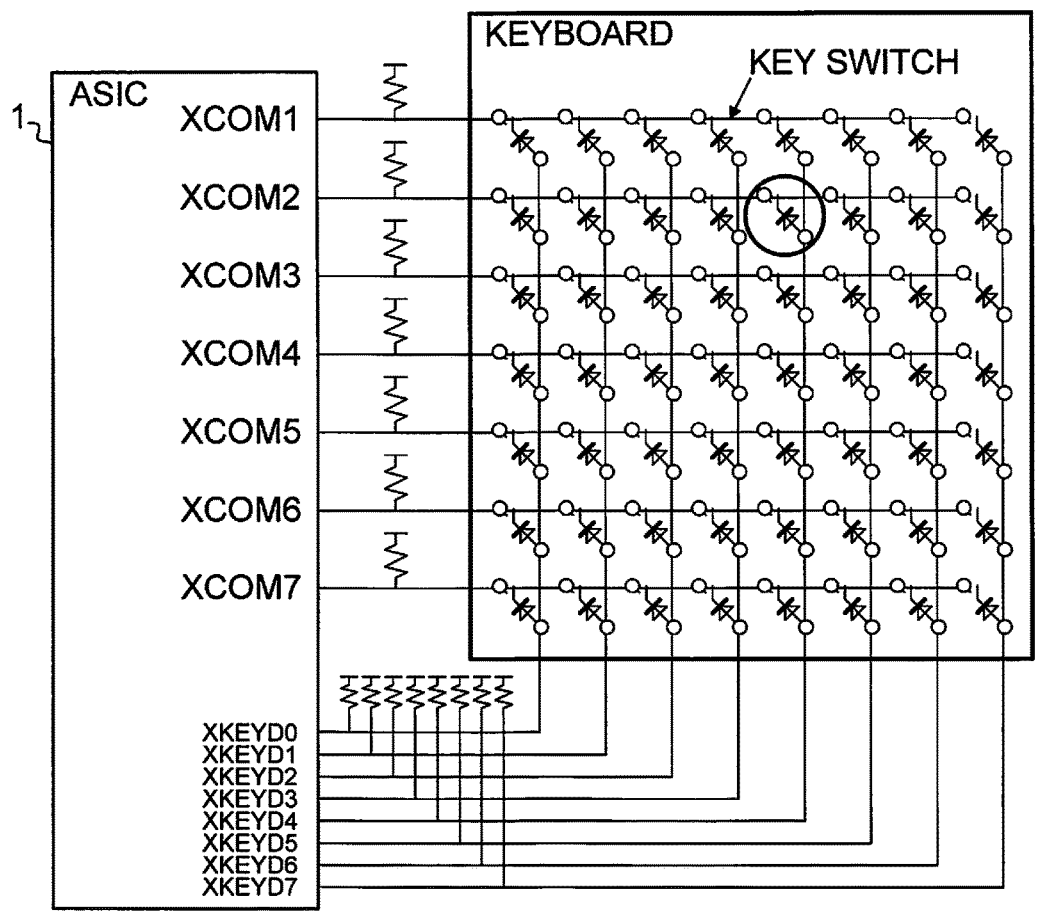
FIG. 15 is a diagram illustrating a display example of a diagnosis screen of the matrix circuit in FIG. 11.
FIG. 17 is a diagram of a configuration of a matrix circuit according to the related art.

The states of the monitoring signal lines saved in the memory 2 can be displayed on a diagnosis screen along with values expected to be detected through the monitoring signal lines during the normal period. FIG. 15 depicts a display example of the diagnosis screen. When the common signal lines to be driven, the values expected to be detected through the monitoring signal lines during the normal period, and measured values detected through the monitoring signal lines are arranged in the screen as depicted in FIG. 15, an operator can determine a failure occurring on the common signal lines.

<3.4 Flowchart of a Fault Diagnosis Process through the Monitoring Signal Lines>

FIG. 16 is a flowchart of a fault diagnosis process using the monitoring signal lines.

[Step SB01] It is determined whether or not the input to each of the monitoring signal lines during a scan of the common signal lines is the same as the normal value. When the input to the monitoring signal line during the scan of the common signal lines is the same as the normal value, the process returns to step SB01. When the input to the monitoring signal line during the scan of the common signal lines is different from the normal value, the process proceeds to step SB02.

[Step SB02] The inputs to the monitoring signal lines during one scan of the common signal lines are stored in the memory.

[Step SB03] It is determined whether or not the inputs to the monitoring signal lines for one scan stored in step SB02 include the value "000". When the inputs to the monitoring signal lines for one scan of the common signal lines include the value "000", the process proceeds to step SB04. When the inputs to the monitoring signal lines for one scan of the common signal lines do not include the value "000", the process proceeds to step SB07.

[Step SB04] It is determined whether or not the inputs to the monitoring signal lines for one scan stored in step SB02 correspond to any of the patterns in the table in FIG. 13. When the inputs to the monitoring signal lines for one scan stored in step SB02 correspond to one of the patterns in the table in FIG. 13, the process proceeds to step SB05. When the inputs to the monitoring signal lines for one scan stored in step SB02 correspond to none of the patterns in the table in FIG. 13, the process proceeds to step SB06.

[Step SB05] It is determined that a ground fault or disconnection has occurred on the corresponding common signal line in the table in FIG. 13.

[Step SB06] It is determined that a fault other than a ground fault, a short circuit, and disconnection has occurred.

[Step SB07] It is determined whether or not the inputs to the monitoring signal lines for one scan stored in step SB02 are the same at certain locations on the monitoring signal lines. When the inputs to the monitoring signal lines for one scan stored in step S302 are the same at certain locations on the monitoring signal lines, the process proceeds to step SB08. When the inputs to the monitoring signal lines for one scan stored in step SB02 are not the same at any locations on the monitoring signal lines, the process proceeds to step SB11.

[Step SB08] It is determined whether or not the inputs to the monitoring signal lines for one scan stored in step SB02 correspond to any of the patterns in the table in FIG. 14. When the inputs to the monitoring signal lines for one scan stored in step SB02 correspond to one of the patterns in the table in FIG. 14, the process proceeds to step SB09. When the inputs to the monitoring signal lines for one scan stored in step SB02 correspond to none of the patterns in the table in FIG. 14, the process proceeds to step SB10.

[Step SB09] It is determined that a short circuit has occurred on the corresponding common signal line in the table in FIG. 14.

[Step SB10] It is determined that a fault other than a ground fault, a short circuit, and disconnection has occurred.

[Step SB11] It is determined that a fault other than a ground fault, a short circuit, and disconnection has occurred.

The embodiments of the present invention have been described above. However, the present invention is not limited to the above-described embodiments, but may be implemented in other aspects by making appropriate changes to the embodiments.

What is claimed is:

1. A matrix circuit of a sink type, the matrix circuit comprising:
    m common signal lines and n data signal lines, where m is a natural number and n is a natural number, the common signal lines and the data signal lines being arranged in a matrix;
    m×n switches each connected between one of the common signal lines and one of the data signal lines intersecting each other, the matrix circuit being configured such that states of keys are scanned by driving the common signal lines to a low level one by one while reading states of the data signal lines;
    p monitoring signal lines to allow states of the common signal lines to be monitored, where p is a natural number;
    a storage unit in which inputs to the monitoring signal lines during one scan of the common signal lines are stored; and
    a detection unit that detects occurrence of a fault including a ground fault, a short circuit, or disconnection on any of the common signal lines to identify the faulty common signal line, wherein
    when a ground fault has occurred on any of the common signal lines, the detection unit:
        determines that a ground fault has occurred on the common signal line when all of the inputs to the monitoring signal lines are not 0 or at a high level during a non-scan period when none of the common signal lines are driven, and
        determines a location of the ground fault on the common signal line based on data input to the monitoring signal lines.

2. A matrix circuit of a sink type, the matrix circuit comprising:
    m common signal lines and n data signal lines, where m is a natural number and n is a natural number, the common signal lines and the data signal lines being arranged in a matrix;
    m×n switches each connected between one of the common signal lines and one of the data signal lines intersecting each other, the matrix circuit being configured such that states of keys are scanned by driving the common signal lines to a low level one by one while reading states of the data signal lines;
    p monitoring signal lines to allow states of the common signal lines to be monitored, where p is a natural number;
    a storage unit in which inputs to the monitoring signal lines during one scan of the common signal lines are stored; and
    a detection unit that detects occurrence of a fault including a ground fault, a short circuit, or disconnection on any of the common signal lines to identify the faulty common signal line, wherein
    when a ground fault has occurred on any of the common signal lines, the detection unit:
        detects occurrence of a fault on the common signal line and stores the inputs to the monitoring signal lines for one scan in the storage unit when the inputs to the monitoring signal lines during the scan are different from the inputs to the monitoring signal lines during a normal period,
        further determines that the fault on the common signal line is a ground fault when the stored inputs to the monitoring signal lines are constantly 1 or at a low level, and
        determines a location of the ground fault on the common signal line based on data input to the monitoring signal lines and stored in the storage unit.

3. A matrix circuit of a sink type, the matrix circuit comprising:
    m common signal lines and n data signal lines, where m is a natural number and n is a natural number, the common signal lines and the data signal lines being arranged in a matrix;
    m×n switches each connected between one of the common signal lines and one of the data signal lines intersecting each other, the matrix circuit being configured such that states of keys are scanned by driving the common signal lines to a low level one by one while reading states of the data signal lines;
p monitoring signal lines to allow states of the common signal lines to be monitored, where p is a natural number;
a storage unit in which inputs to the monitoring signal lines during one scan of the common signal lines are stored; and
a detection unit that detects occurrence of a fault including a ground fault, a short circuit, or disconnection on any of the common signal lines to identify the faulty common signal line, wherein
when a short circuit has occurred on any of the common signal lines, the detection unit:
  detects occurrence of a fault on the common signal line and stores the inputs to the monitoring signal lines for one scan in the storage unit when the inputs to the monitoring signal lines during the scan are different from the inputs to the monitoring signal lines during a normal period,
  further determines that the fault on the common signal line is a short circuit when the stored inputs to the monitoring signal lines are the same as the inputs to the monitoring signal lines during a different scan of the common signal lines, and
  determines a location of the short circuit on the common signal line based on data input to the monitoring signal lines and stored in the storage unit.

4. A matrix circuit of a sink type, the matrix circuit comprising:
m common signal lines and n data signal lines, where m is a natural number and n is a natural number, the common signal lines and the data signal lines being arranged in a matrix;
m×n switches each connected between one of the common signal lines and one of the data signal lines intersecting each other, the matrix circuit being configured such that states of keys are scanned by driving the common signal lines to a low level one by one while reading states of the data signal lines;
p monitoring signal lines to allow states of the common signal lines to be monitored, where p is a natural number;
a storage unit in which inputs to the monitoring signal lines during one scan of the common signal lines are stored; and
a detection unit that detects occurrence of a fault including a ground fault, a short circuit, or disconnection on any of the common signal lines to identify the faulty common signal line, wherein
when disconnection has occurred on any of the common signal lines, the detection unit:
  detects occurrence of a fault on the common signal line and stores the inputs to the monitoring signal lines for one scan in the storage unit when the inputs to the monitoring signal lines during the scan are different from the inputs to the monitoring signal lines during a normal period,
  further determines that the fault on the common signal line is disconnection when all of the stored inputs to the monitoring signal line are 0 or at a high level, and
  determines a location of the disconnection on the common signal line based on data input to the monitoring signal lines and stored in the storage unit.

5. A matrix circuit of a sink type, the matrix circuit comprising:
m common signal lines and n data signal lines, where m is a natural number and n is a natural number, the common signal lines and the data signal lines being arranged in a matrix;
m×n switches each connected between one of the common signal lines and one of the data signal lines intersecting each other, the matrix circuit being configured such that states of keys are scanned by driving the common signal lines to a low level one by one while reading states of the data signal lines;
p monitoring signal lines to allow states of the common signal lines to be monitored, where p is a natural number; and
a detection unit that detects a ground fault on any of the common signal lines and that identifies the common signal line on which the ground fault has occurred, wherein
when a ground fault has occurred on any of the common signal lines, the detection unit:
  determines that a ground fault has occurred on the common signal line when all of the inputs to the monitoring signal lines are not 0 or at a high level during a non-scan period when none of the common signal lines are driven, and
  determines a location of the ground fault on the common signal line based on data input to the monitoring signal lines.

6. A matrix circuit of a source type, the matrix circuit comprising:
m common signal lines and n data signal lines, where m is a natural number and n is a natural number, the common signal lines and the data signal lines being arranged in a matrix;
m×n switches each connected between one of the common signal lines and one of the data signal lines intersecting each other, the matrix circuit being configured such that states of keys are scanned by driving the common signal lines to a high level one by one while reading states of the data signal lines;
p monitoring signal lines to allow states of the common signal lines to be monitored, where p is a natural number;
a storage unit in which inputs to the monitoring signal lines during one scan of the common signal lines are stored; and
a detection unit that detects occurrence of a fault including a ground fault, a short circuit, or disconnection on any of the common signal lines to identify the faulty common signal line, wherein
when a ground fault or disconnection has occurred on any of the common signal lines, the detection unit:
  detects occurrence of a fault on the common signal line and stores the inputs to the monitoring signal lines for one scan in the storage unit when the inputs to the monitoring signal lines during the scan are different from the inputs to the monitoring signal lines during a normal period,
  further determines that the fault on the common signal line is a ground fault or disconnection when all of the stored inputs to the monitoring signal line are 0 or at a high level, and
  determines a location of the ground fault or the disconnection on the common signal line based on data input to the monitoring signal lines and stored in the storage unit.

* * * * *